US 9,490,347 B2
(12) United States Patent
Rosenbaum et al.

(10) Patent No.: US 9,490,347 B2
(45) Date of Patent: Nov. 8, 2016

(54) CAPPING DIELECTRIC STRUCTURES FOR TRANSISTOR GATES

(71) Applicant: Intel Corporation, Santa Clara, CA (US)

(72) Inventors: Aaron W. Rosenbaum, Portland, OR (US); Din-How Mei, Portland, OR (US); Sameer S. Pradhan, Portland, OR (US)

(73) Assignee: Intel Corporation, Santa Clara, CA (US)

(*) Notice: Subject to any disclaimer, the term of this patent is extended or adjusted under 35 U.S.C. 154(b) by 0 days.

(21) Appl. No.: 14/925,741

(22) Filed: Oct. 28, 2015

(65) Prior Publication Data

US 2016/0049499 A1    Feb. 18, 2016

Related U.S. Application Data

(63) Continuation of application No. 13/992,598, filed as application No. PCT/US2011/054464 on Sep. 30, 2011, now Pat. No. 9,202,699.

(51) Int. Cl.
| | |
|---|---|
| *H01L 29/66* | (2006.01) |
| *H01L 21/02* | (2006.01) |
| *H01L 21/28* | (2006.01) |
| *H01L 29/78* | (2006.01) |
| *H01L 21/768* | (2006.01) |

(52) U.S. Cl.
CPC ..... *H01L 29/66795* (2013.01); *H01L 21/0217* (2013.01); *H01L 21/02167* (2013.01); *H01L 21/02274* (2013.01); *H01L 21/28008* (2013.01); *H01L 21/28247* (2013.01); *H01L 29/6656* (2013.01); *H01L 29/66545* (2013.01); *H01L 29/785* (2013.01); *H01L 21/76897* (2013.01); *H01L 2029/7858* (2013.01)

(58) Field of Classification Search
None
See application file for complete search history.

(56) References Cited

U.S. PATENT DOCUMENTS

| | | | |
|---|---|---|---|
| 5,399,415 | A | 3/1995 | Chen et al. |
| 6,030,692 | A | 2/2000 | Auger |
| 6,136,697 | A | 10/2000 | Wu |
| 6,331,481 | B1 | 12/2001 | Stamper et al. |
| 6,617,226 | B1 | 9/2003 | Suguro et al. |
| 6,720,261 | B1 | 4/2004 | Anderson et al. |
| 7,456,471 | B2 | 11/2008 | Anderson et al. |

(Continued)

FOREIGN PATENT DOCUMENTS

| | | |
|---|---|---|
| CN | 1848454 A | 10/2006 |
| CN | 102104061 A | 6/2011 |

(Continued)

OTHER PUBLICATIONS

Office Action received for Korean Patent Application No. 10-2014-7007872, mailed on Feb. 4, 2016, 4 page of English Translation only.

(Continued)

*Primary Examiner* — Angel Roman
(74) *Attorney, Agent, or Firm* — Winkle, PLLC

(57) ABSTRACT

The present description relates to the field of fabricating microelectronic transistors, including non-planar transistors, for microelectronic devices. Embodiments of the present description relate to the formation a recessed gate electrode capped by a substantially void-free dielectric capping dielectric structure which may be formed with a high density plasma process.

13 Claims, 13 Drawing Sheets

(56) References Cited

U.S. PATENT DOCUMENTS

| | | |
|---|---|---|
| 7,528,025 B2 | 5/2009 | Brask et al. |
| 8,981,435 B2 | 3/2015 | Pradhan et al. |
| 9,087,915 B2 | 7/2015 | Pradhan et al. |
| 9,177,867 B2 | 11/2015 | Pradhan et al. |
| 2002/0130372 A1 | 9/2002 | Kwon et al. |
| 2003/0035947 A1 | 2/2003 | Heberger et al. |
| 2004/0161924 A1* | 8/2004 | Chen ............... H01L 21/76832 438/637 |
| 2004/0203211 A1 | 10/2004 | Yang et al. |
| 2005/0019993 A1 | 1/2005 | Lee et al. |
| 2005/0023133 A1 | 2/2005 | Lippitt et al. |
| 2005/0037557 A1 | 2/2005 | Doczy et al. |
| 2005/0051854 A1 | 3/2005 | Cabral et al. |
| 2005/0093081 A1 | 5/2005 | Belyansky et al. |
| 2006/0046449 A1 | 3/2006 | Liaw |
| 2006/0071275 A1 | 4/2006 | Brask et al. |
| 2006/0088967 A1 | 4/2006 | Hsiao et al. |
| 2006/0099783 A1 | 5/2006 | Gluschenkov et al. |
| 2006/0157749 A1 | 7/2006 | Okuno |
| 2006/0175669 A1 | 8/2006 | Kim et al. |
| 2006/0189058 A1 | 8/2006 | Lee et al. |
| 2006/0223290 A1 | 10/2006 | Belyansky et al. |
| 2007/0066184 A1 | 3/2007 | Nagamoto et al. |
| 2007/0111435 A1 | 5/2007 | Kim et al. |
| 2007/0148881 A1 | 6/2007 | Tseng et al. |
| 2008/0001187 A1 | 1/2008 | Booth et al. |
| 2008/0014710 A1 | 1/2008 | Bian et al. |
| 2008/0067613 A1 | 3/2008 | Anderson et al. |
| 2008/0090397 A1 | 4/2008 | Brask et al. |
| 2008/0233699 A1 | 9/2008 | Booth et al. |
| 2008/0265321 A1 | 10/2008 | Yu et al. |
| 2008/0283906 A1 | 11/2008 | Bohr et al. |
| 2008/0290380 A1 | 11/2008 | Sheu et al. |
| 2009/0081836 A1 | 3/2009 | Liu et al. |
| 2009/0142991 A1 | 6/2009 | Moon et al. |
| 2009/0321841 A1 | 12/2009 | Hoentschel et al. |
| 2010/0032728 A1 | 2/2010 | Hao et al. |
| 2010/0048007 A1 | 2/2010 | Lee et al. |
| 2010/0105215 A1 | 4/2010 | Sugawara et al. |
| 2010/0133614 A1 | 6/2010 | Beyer et al. |
| 2010/0155842 A1 | 6/2010 | Anderson et al. |
| 2011/0034026 A1 | 2/2011 | Sunayama et al. |
| 2011/0108930 A1* | 5/2011 | Cheng ............... H01L 21/76831 257/412 |
| 2011/0147812 A1 | 6/2011 | Steigerwald et al. |
| 2011/0147831 A1 | 6/2011 | Steigerwald et al. |
| 2011/0147851 A1 | 6/2011 | Thomas et al. |
| 2011/0147858 A1 | 6/2011 | Lim et al. |
| 2011/0151250 A1 | 6/2011 | Yasuda et al. |
| 2011/0156107 A1 | 6/2011 | Bohr et al. |
| 2011/0217541 A1 | 9/2011 | Shimano et al. |
| 2011/0237062 A1 | 9/2011 | Na et al. |
| 2011/0272739 A1 | 11/2011 | Lee et al. |
| 2011/0281509 A1 | 11/2011 | Tanaka et al. |
| 2012/0001266 A1 | 1/2012 | Lim et al. |
| 2012/0058616 A1* | 3/2012 | Ahn ............... H01L 21/02532 438/285 |
| 2012/0313170 A1 | 12/2012 | Chang et al. |
| 2013/0062669 A1* | 3/2013 | Chen ............... H01L 29/401 257/288 |
| 2013/0065371 A1 | 3/2013 | Wei et al. |
| 2013/0334713 A1 | 12/2013 | Xu et al. |
| 2015/0155385 A1 | 6/2015 | Pradhan et al. |
| 2016/0020304 A1 | 1/2016 | Pradhan et al. |
| 2016/0035724 A1 | 2/2016 | Pradhan et al. |
| 2016/0035725 A1 | 2/2016 | Pradhan et al. |

FOREIGN PATENT DOCUMENTS

| | | |
|---|---|---|
| JP | 2000-031291 A | 1/2000 |
| JP | 2002-184981 A | 6/2002 |
| JP | 2004-128314 A | 4/2004 |
| JP | 2010-050215 A | 3/2010 |
| KR | 10-2002-0056285 A | 7/2002 |
| KR | 10-2004-0050519 A | 6/2004 |
| KR | 10-0585178 B1 | 5/2006 |
| KR | 10-0653711 B1 | 12/2006 |
| KR | 10-2007-0122319 A | 12/2007 |
| KR | 10-2008-0021918 A | 3/2008 |
| KR | 10-2009-0012793 A | 2/2009 |
| TW | 201110324 A | 3/2011 |
| TW | 201123448 A | 7/2011 |
| TW | 201208078 A | 2/2012 |
| TW | 201236153 A | 9/2012 |
| WO | 2011/087571 A1 | 7/2011 |
| WO | 2011/090571 A2 | 7/2011 |
| WO | 2013/048449 A1 | 4/2013 |
| WO | 2013/048516 A1 | 4/2013 |
| WO | 2013/048524 A1 | 4/2013 |
| WO | 2013/085490 A1 | 6/2013 |
| WO | 2013/095527 A1 | 6/2013 |

OTHER PUBLICATIONS

Office Action received for Taiwan Patent Application No. 101144138, mailed on Feb. 17, 2016, 6 pages of Taiwan Office Action and 1 page English Search report.

Office Action received for Chinese Patent Application No. 201180073728.1, mailed on Dec. 2, 2015, 9 pages of English Translation and 8 pages of Chinese Office Action.

Office Action received for Chinese Patent Application No. 201180073809.1, mailed on Dec. 28, 2015, 8 pages of Chinese Office Action only.

Office Action received for Chinese Patent Application No. 201180074516.5, mailed on Jan. 26, 2016, 17 pages of English Translation and 10 pages of Chinese Office Action.

Office Action received for Taiwan Patent Application No. 101133821, mailed on Dec. 25, 2014, 7 pages of English Translation and 9 pages of Taiwan Office Action.

Office Action received for Taiwan Patent Application No. 101133821, mailed on Aug. 6, 2014, 7 pages of English Translation and 9 pages of Taiwan Office Action.

Office Action received for Taiwan Patent Application No. 101134489, mailed on May 1, 2015, 2 pages of Taiwan Office Action and 1 page of English Search Report.

Office Action received for Taiwan Patent Application No. 101135607, mailed on May 8, 2015, 5 pages of Taiwan Office Action and 1 page of Search Report.

Office Action received for Korean Patent Application No. 10-2014-7007165, mailed on Apr. 14, 2015, 5 pages of Korean Office Action and 3 page of English Translation.

Office Action received for Korean Patent Application No. 10-2014-7007165, mailed on Oct. 19, 2015, 6 pages of English Translation and 3 pages of Korean Office Action.

Office Action received for Korean Patent Application No. 10-2014-7007872, mailed on Apr. 28, 2015, 5 pages of Korean Office Action and 4 page of English Translation.

Extended European Search Report received for European Patent Application No. 11873428.4, mailed on Jul. 8, 2015, 9 pages.

Extended European Search Report received for European Patent Application No. 11873523.2, mailed on May 18, 2015, 8 Pages.

Office Action received for Japanese Patent Application No. 2014-533283, mailed on Feb. 10, 2015, 2 pages of English Translation and 1 pages of Japanese Office Action.

International Preliminary Report on Patentability and Written Opinion received for PCT Patent Application No. PCT/US2011/054294, mailed on Apr. 10, 2014, 5 pages.

International Search Report and Written Opinion received for PCT Patent Application No. PCT/US2011/054294, mailed on May 15, 2012, 8 pages.

International Preliminary Report on Patentability and Written Opinion received for PCT Patent Application No. PCT/US2011/054464, mailed on Apr. 10, 2014, 6 pages.

International Search Report and Written Opinion Received for PCT Patent Application No. PCT/US2011/054464, mailed on May 15, 2012, 9 pages.

(56) References Cited

OTHER PUBLICATIONS

International Search Report and Written Opinion Received for PCT Patent Application No. PCT/US2011/054479, mailed on May 16, 2012, 9 pages.
International Preliminary Report on Patentability received for PCT Patent Application No. PCT/US2011/054479, mailed on Apr. 10, 2014, 9 pages.
International Preliminary Report on Patentability and Written Opinion received for PCT Patent Application No. PCT/US2011/063433, mailed on Jun. 19, 2014, 10 pages.
International Search Report and Written Opinion Received for PCT Patent Application No. PCT/US2011/063433, Mailed on Jul. 20, 2012, 9 pages.
International Preliminary Report on Patentability and Written Opinion received for PCT Patent Application No. PCT/US2011/066921, mailed on Jul. 3, 2014, 14 pages.
International Search Report and Written Opinion Received for PCT Patent Application No. PCT/US2011/066921, Mailed on Sep. 27, 2012, 11 pages.
Office Action received for Korean Patent Application No. 10-2015-7027031, mailed on Nov. 18, 2015, 5 pages of English Translation and 6 pages of Korean Office Action.
Office Action received for Korean Patent Application No. 10-2014-7007165, mailed on Dec. 18, 2015, 5 pages of English Translation and 5 pages of Korean Office Action.

\* cited by examiner

CAPPING DIELECTRIC STRUCTURES FOR TRANSISTOR GATES

RELATED APPLICATIONS

The present application is a continuation of U.S. patent application Ser. No. 13/992,598, filed on Jun. 7, 2013, entitled "CAPPING DIELECTRIC STRUCTURE FOR TRANSISTOR GATES", which claims priority under 35 U.S.C. 371 from International Application No. PCT/US2011/054464, filed on Sep. 30, 2011, entitled "CAPPING DIELECTRONIC STRUCTURE FOR TRANSISTOR GATES", which are hereby incorporated herein by reference in their entirety and for all purposes.

BACKGROUND

Embodiments of the present description generally relate to the field of microelectronic device fabrication and, more particularly, to the fabrication of capping dielectric structures within non-planar transistor gates.

BRIEF DESCRIPTION OF THE DRAWINGS

The subject matter of the present disclosure is particularly pointed out and distinctly claimed in the concluding portion of the specification. The foregoing and other features of the present disclosure will become more fully apparent from the following description and appended claims, taken in conjunction with the accompanying drawings. It is understood that the accompanying drawings depict only several embodiments in accordance with the present disclosure and are, therefore, not to be considered limiting of its scope. The disclosure will be described with additional specificity and detail through use of the accompanying drawings, such that the advantages of the present disclosure can be more readily ascertained, in which:

DETAILED DESCRIPTION

Figure 1:
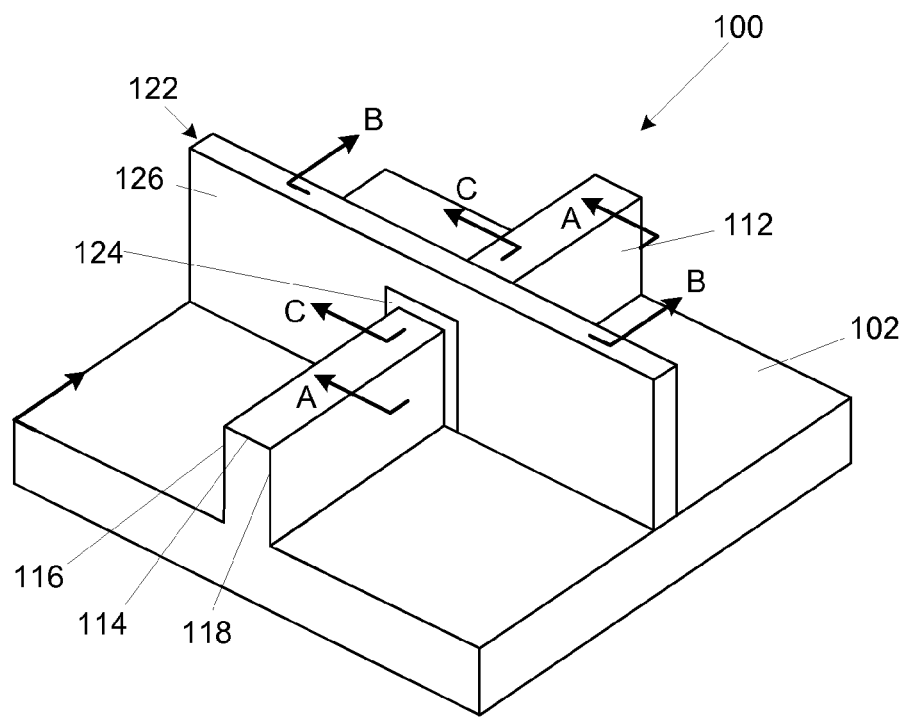
FIG. 1 is a perspective view of a non-planar transistor, according to an embodiment of the present description.

In the following detailed description, reference is made to the accompanying drawings that show, by way of illustration, specific embodiments in which the claimed subject matter may be practiced. These embodiments are described in sufficient detail to enable those skilled in the art to practice the subject matter. It is to be understood that the various embodiments, although different, are not necessarily mutually exclusive. For example, a particular feature, structure, or characteristic described herein, in connection with one embodiment, may be implemented within other embodiments without departing from the spirit and scope of the claimed subject matter. References within this specification to "one embodiment" or "an embodiment" mean that a particular feature, structure, or characteristic described in connection with the embodiment is included in at least one implementation encompassed within the present invention. Therefore, the use of the phrase "one embodiment" or "in an embodiment" does not necessarily refer to the same embodiment. In addition, it is to be understood that the location or arrangement of individual elements within each disclosed embodiment may be modified without departing from the spirit and scope of the claimed subject matter. The following detailed description is, therefore, not to be taken in a limiting sense, and the scope of the subject matter is defined only by the appended claims, appropriately interpreted, along with the full range of equivalents to which the appended claims are entitled. In the drawings, like numerals refer to the same or similar elements or functionality throughout the several views, and that elements depicted therein are not necessarily to scale with one another, rather individual elements may be enlarged or reduced in order to more easily comprehend the elements in the context of the present description.

In the fabrication of non-planar transistors, such as tri-gate transistors and FinFETs, non-planar semiconductor bodies may be used to form transistors capable of full depletion with very small gate lengths (e.g., less than about 30 nm). These semiconductor bodies are generally fin-shaped and are, thus, generally referred to as transistor "fins". For example in a tri-gate transistor, the transistor fins have a top surface and two opposing sidewalls formed on a bulk semiconductor substrate or a silicon-on-insulator substrate. A gate dielectric may be formed on the top surface and sidewalls of the semiconductor body and a gate electrode may be formed over the gate dielectric on the top surface of the semiconductor body and adjacent to the gate dielectric on the sidewalls of the semiconductor body. Thus, since the gate dielectric and the gate electrode are adjacent to three surfaces of the semiconductor body, three separate channels and gates are formed. As there are three separate channels formed, the semiconductor body can be fully depleted when the transistor is turned on. With regard to finFET transistors, the gate material and the electrode only contact the sidewalls of the semiconductor body, such that two separate channels are formed (rather than three in tri-gate transistors).

Embodiments of the present description relate to the formation of microelectronic transistors, wherein the transistor includes a recessed gate electrode capped by a substantially void-free dielectric capping dielectric structure which may be formed with a high density plasma process. Although embodiments herein are described in terms of non-planar transistors and replacement gate techniques, the subject matter is not so limited, as the subject matter may be used in planar transistors and in non-replacement gate applications.

FIG. 1 is a perspective view of a non-planar transistor 100, including at least one gate formed on at least one transistor fin, which are formed on a microelectronic substrate 102. In an embodiment of the present disclosure, the microelectronic substrate 102 may be a monocrystalline silicon substrate. The microelectronic substrate 102 may also be other types of substrates, such as silicon-on-insulator ("SOI"), germanium, gallium arsenide, indium antimonide, lead telluride, indium arsenide, indium phosphide, gallium arsenide, gallium antimonide, and the like, any of which may be combined with silicon.

The non-planar transistor, shown as a tri-gate transistor, may include at least one non-planar transistor fin 112. The non-planar transistor fin 112 may have a top surface 114 and a pair of laterally opposite sidewalls, sidewall 116 and opposing sidewall 118, respectively.

As further shown in FIG. 1, at least one non-planar transistor gate 122 may be formed over the non-planar transistor fin 112. The non-planar transistor gate 122 may be fabricated by forming a gate dielectric layer 124 on or adjacent to the non-planar transistor fin top surface 114 and on or adjacent to the non-planar transistor fin sidewall 116 and the opposing non-planar transistor fin sidewall 118. A gate electrode 126 may be formed on or adjacent the gate dielectric layer 124. In one embodiment of the present disclosure, the non-planar transistor fin 112 may run in a direction substantially perpendicular to the non-planar transistor gate 122.

The gate dielectric layer 124 may be formed from any well-known gate dielectric material, including but not limited to silicon dioxide ($SiO_2$), silicon oxynitride ($SiO_xN_y$), silicon nitride ($Si_3N_4$), and high-k dielectric materials such as hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. The gate dielectric layer 124 can be formed by well-known techniques, such as by conformally depositing a gate dielectric material and then patterning the gate dielectric material with well-known photolithography and etching techniques, as will be understood to those skilled in the art.

The gate electrode 126 can be formed of any suitable gate electrode material. In an embodiment of the present disclosure, the gate electrode 126 may be formed from materials that include, but are not limited to, polysilicon, tungsten, ruthenium, palladium, platinum, cobalt, nickel, hafnium, zirconium, titanium, tantalum, aluminum, titanium carbide, zirconium carbide, tantalum carbide, hafnium carbide, aluminum carbide, other metal carbides, metal nitrides, and metal oxides. The gate electrode 126 can be formed by well-known techniques, such as by blanket depositing a gate electrode material and then patterning the gate electrode material with well-known photolithography and etching techniques, as will be understood to those skilled in the art.

A source region and a drain region (not shown in FIG. 1) may be formed in the non-planar transistor fin 112 on opposite sides of the gate electrode 126. In one embodiment, the source and drain regions may be formed by doping the non-planar transistor fins 112, as will be understood to those skilled in the art. In another embodiment, the source and drain regions may be formed by removing portions of the non-planar transistor fins 112 and replacing these portions with appropriate material(s) to form the source and drain regions, as will be understood to those skilled in the art.

FIGS. 2-26 illustrate side cross-sectional view of one embodiment of fabricating a non-planar transistor, wherein FIGS. 2-5 are views along arrows A-A and B-B of FIG. 1, FIGS. 6-15 are views along arrows A-A of FIG. 1, and FIG. 16-26 are views along arrows C-C of FIG. 1.

Figure 2:
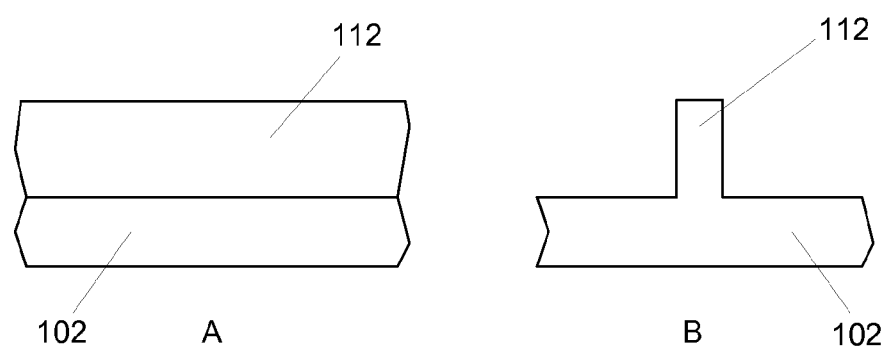
FIG. 2 illustrates a side cross-sectional view of a non-planar transistor fin formed in or on a microelectronic substrate.
Figure 3:
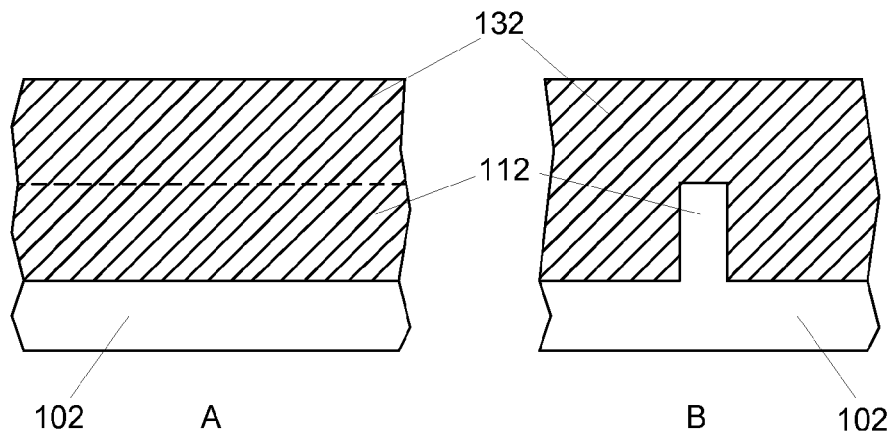
FIG. 3 illustrates a side cross-sectional view of a sacrificial material deposited over the non-planar transistor fin of FIG. 2, according to an embodiment of the present description.
Figure 4:
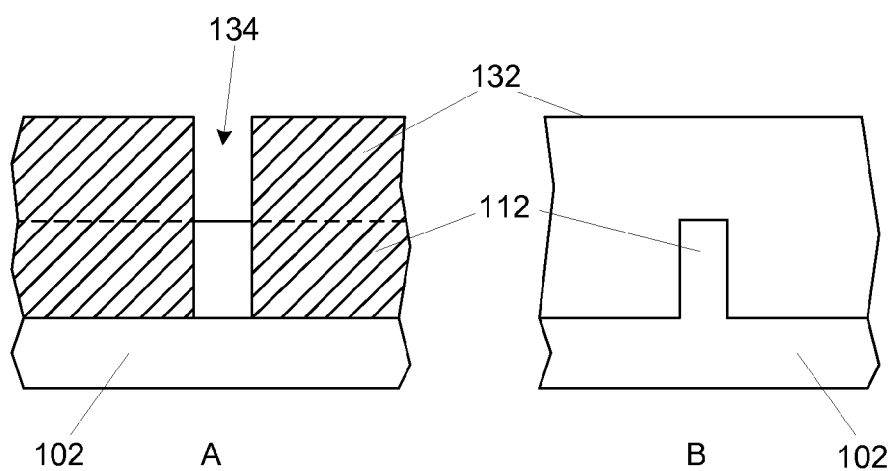
FIG. 4 illustrates a side cross-sectional view of a trench formed in the sacrificial material deposited to expose a portion of the non-planar transistor fin of FIG. 3, according to an embodiment of the present description.

As shown in FIG. 2, the non-planar transistor fin 112 may be formed by etching the microelectronic substrate 102 or by forming the non-planar transistor fin 112 on the microelectronic substrate 102 by any technique known in the art. As illustrate in FIG. 3, a sacrificial material 132 may be deposited over the non-planar transistor fin 112, as shown in FIG. 3, and a trench 134 may be formed in the sacrificial material 132 to expose a portion of the non-planar transistor fin 112, as shown in FIG. 4. The sacrificial material 132 may be any appropriate material known in the art, and the trench 134 may be formed by any technique known in the art, including but not limited to lithographic masking and etching.

Figure 5:
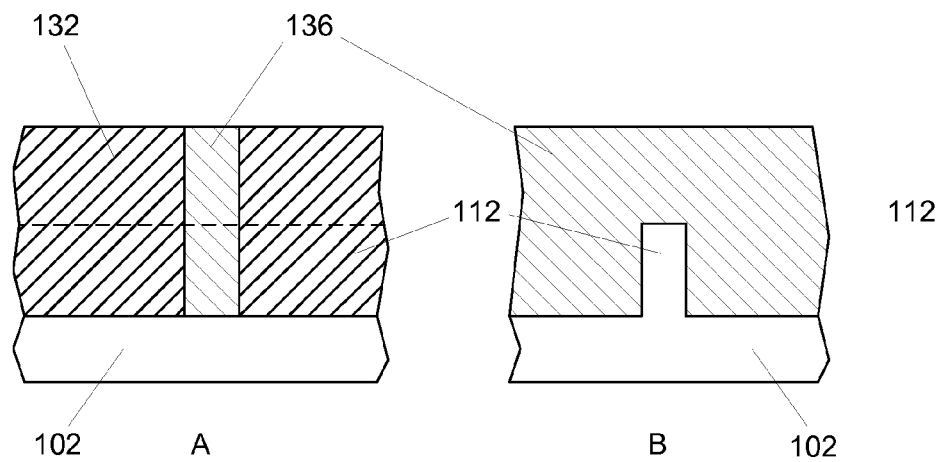
FIG. 5 illustrates a side cross-sectional view of a sacrificial gate formed in the trench of FIG. 4, according to an embodiment of the present description.

As shown in FIG. 5, a sacrificial gate 136 may be formed in the trench 134 (see FIG. 4). The sacrificial gate 136 may be any appropriate material, such as a polysilicon material and the like, and may be deposited in the trench 134 (see FIG. 4) by any technique known in the art, including but not limited to chemical vapor deposition ("CVD") and physical vapor deposition ("PVD").

Figure 6:
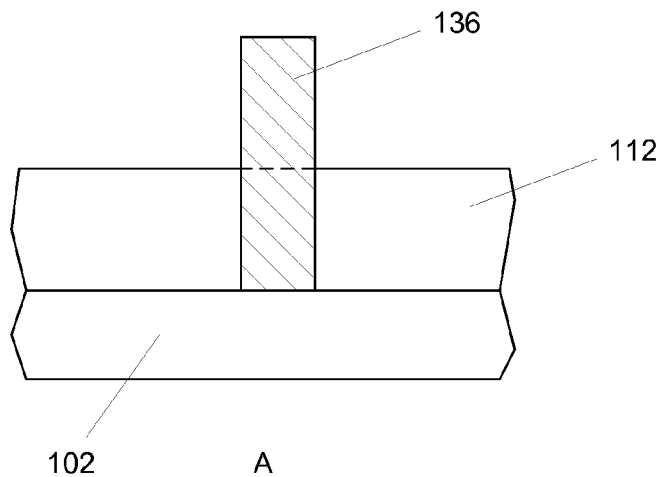
FIG. 6 illustrates a side cross-sectional view of the sacrificial gate after the removal of the sacrificial material of FIG. 5, according to an embodiment of the present description.
Figure 7:
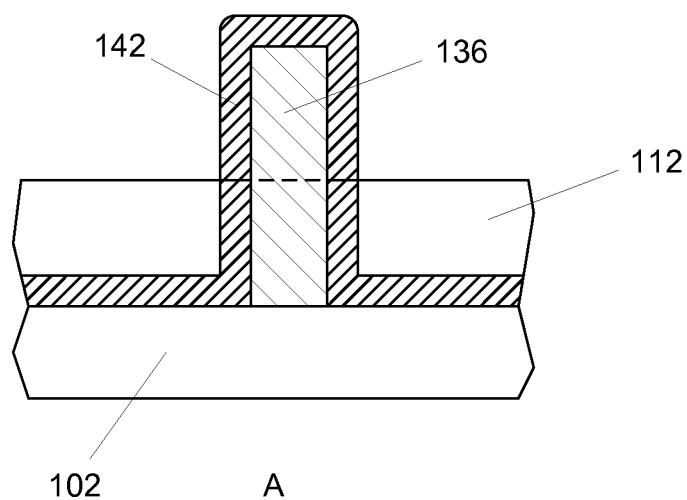
FIG. 7 illustrates a side cross-sectional view of a conformal dielectric layer deposited over the sacrificial gate and microelectronic substrate of FIG. 6, according to an embodiment of the present description.

As shown in FIG. 6, the sacrificial material 132 of FIG. 5 may be removed to expose the sacrificial gate 136 by any technique known in the art, such as selectively etching the sacrificial material 132. As shown in FIG. 7, a conformal dielectric layer 142 may be deposited over the sacrificial gate 136 and microelectronic substrate 102. The conformal dielectric layer 142 may be any appropriate material, including but not limited to silicon nitride ($Si_3N_4$) and silicon carbide (SiC), and may be formed by any appropriate technique including but not limited to atomic layer deposition ("ALD").

Figure 8:
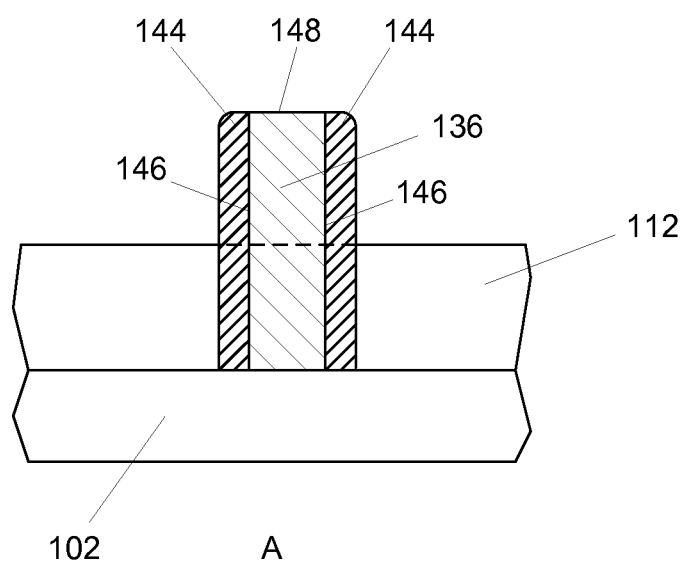
FIG. 8 illustrates a side cross-sectional view of gate spacers formed from the conformal dielectric layer of FIG. 7, according to an embodiment of the present description.

As shown in FIG. 8, the conformal dielectric layer 142 of FIG. 7 may be etched, such as by directional etch with an appropriate etchant, to form a pair of gate spacers 144 on sidewalls 146 of the sacrificial gate 136, while substantially removing the conformal dielectric material layer 142 adjacent the microelectronic substrate 102 and a top surface 148 of the sacrificial gate 136. It is understood that fin spacers (not shown) may be simultaneously formed on sidewalls 116 and 118 (see FIG. 1) of the non-planar transistor fin 112 during the formation of the gate spacers 144.

Figure 9:
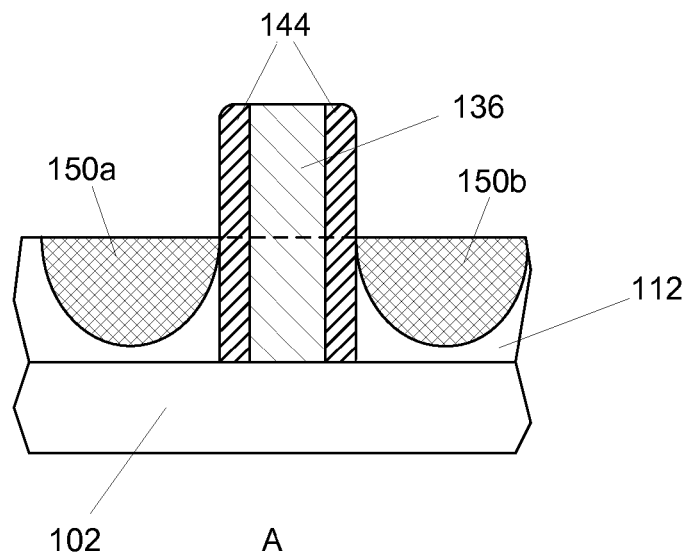
FIG. 9 illustrates a side cross-sectional view of a source region and a drain region formed in the non-planar transistor fin on either side of the gate spacers of FIG. 8, according to an embodiment of the present description.

As shown in FIG. 9, a source region 150a and a drain region 150b may be formed on either side of the gate spacers 144. In one embodiment, the source region 150a and the drain region 150b may be formed in the non-planar transistor fin 112 with the implantation of dopants. As will be understood to those skilled in that art, dopant implantation is a process of introducing impurities into semiconducting materials for the purpose changing its conductivity and electronic properties. This is generally achieved by ion implantation of either P-type ions (e.g. boron) or N-type ions (e.g. phosphorus), collectively referred to as "dopants". In another embodiment, portions of the non-planar transistor fin 112 may be removed by any technique known in the art, such as etching, and the source region 150a and a drain region 150b may be formed in place of the removed portions. The source region 150a and the drain region will hereinafter be referred to collectively as "source/drain region 150".

Figure 10:
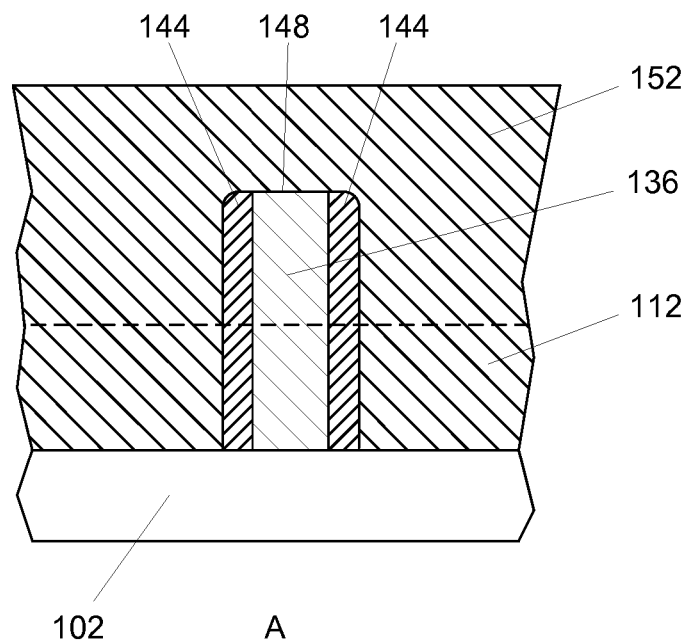
FIG. 10 illustrates a side cross-sectional view of a first dielectric material deposited over the gate spacers, the sacrificial gate, the non-planar transistor fin, and the microelectronic substrate of FIG. 9, according to an embodiment of the present description.
Figure 11:
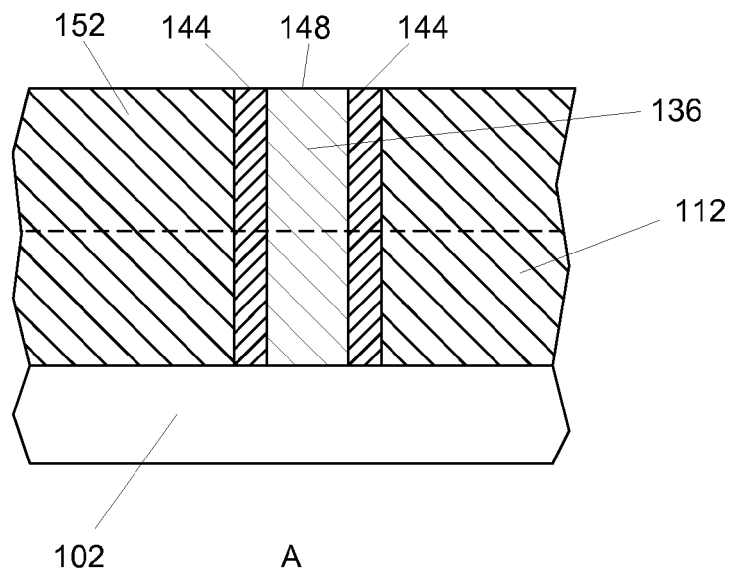
FIG. 11 illustrates a side cross-sectional view of the structure of FIG. 10 after planarizing the first dielectric material to expose a top surface of the sacrificial gate, according to an embodiment of the present description.

As shown in FIG. 10, a first dielectric material layer 152 may be deposited over the gate spacers 144, the sacrificial gate top surface 148, the non-planar transistor fin 112, and the microelectronic substrate 102. The first dielectric material layer 152 may be planarizing to expose the sacrificial gate top surface 148, as shown in FIG. 11. The planarization of the first dielectric material layer 152 may be achieved by any technique known in the art, including but not limited to chemical mechanical polishing (CMP).

Figure 12:
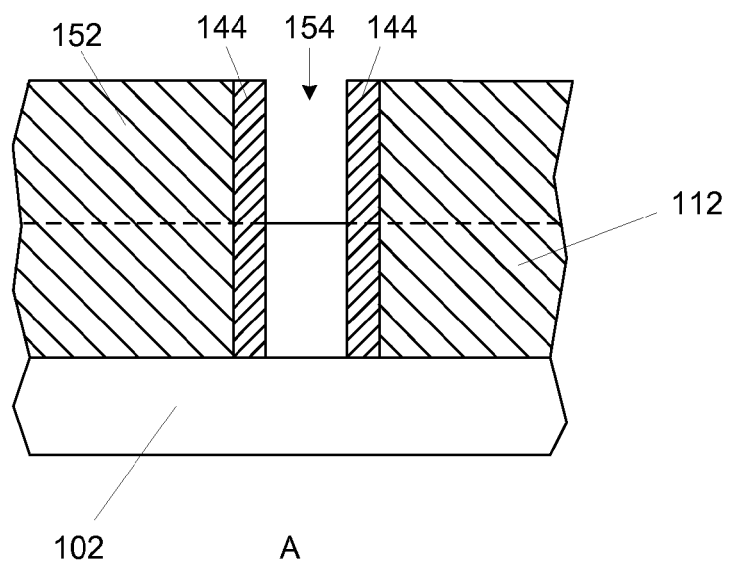
FIG. 12 illustrates a side cross-sectional view of the structure of FIG. 11 after the removal of the sacrificial gate to form a gate trench, according to an embodiment of the present description.
Figure 13:
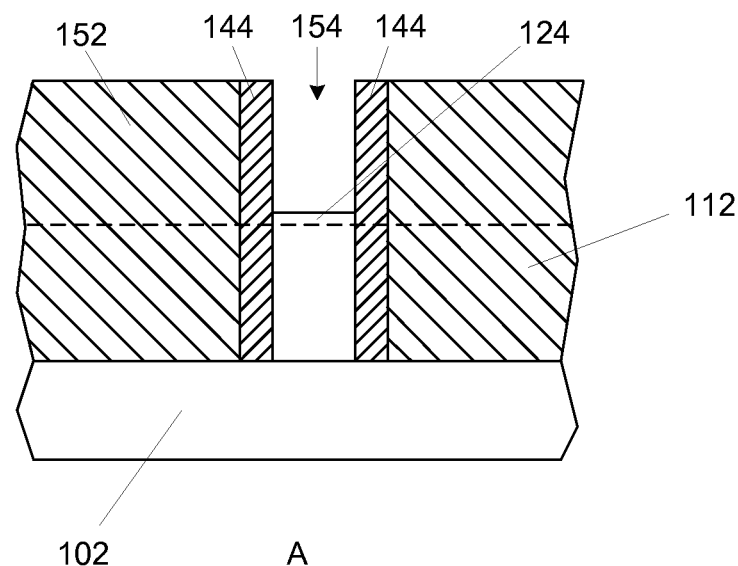
FIG. 13 illustrates a side cross-sectional view of the structure of FIG. 12 after the formation of a gate dielectric adjacent the non-planar transistor fin between the gate spacers, according to an embodiment of the present description.

As shown in FIG. 12, the sacrificial gate 136 of FIG. 11 may be removed to form a gate trench 154. The sacrificial gate 136 may be removed by any technique known in the art, such as a selective etch. As shown in FIG. 13, the gate dielectric layer 124, as also illustrated in FIG. 1, may be formed to abut the non-planar transistor fin 112, as previously discussed.

Figure 14:
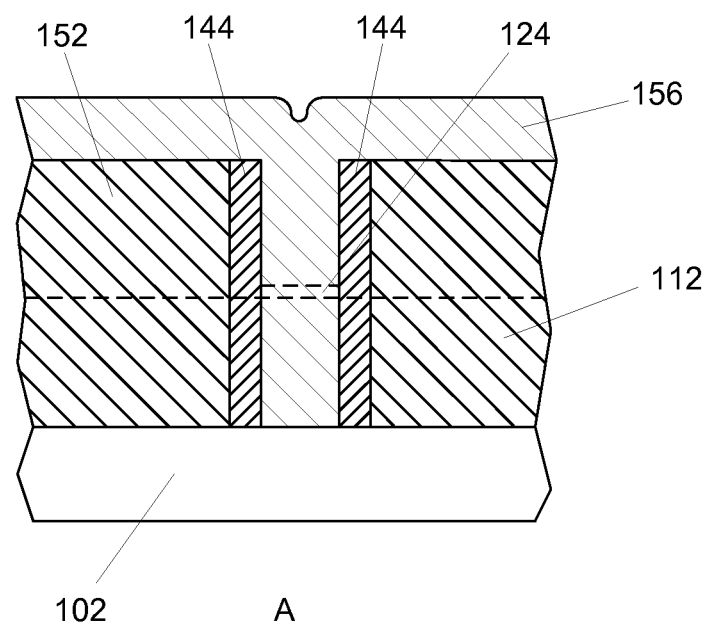
FIG. 14 illustrates a side cross-sectional view of a conductive gate material deposited in the gate trench of FIG. 13, according to an embodiment of the present description.
Figure 15:
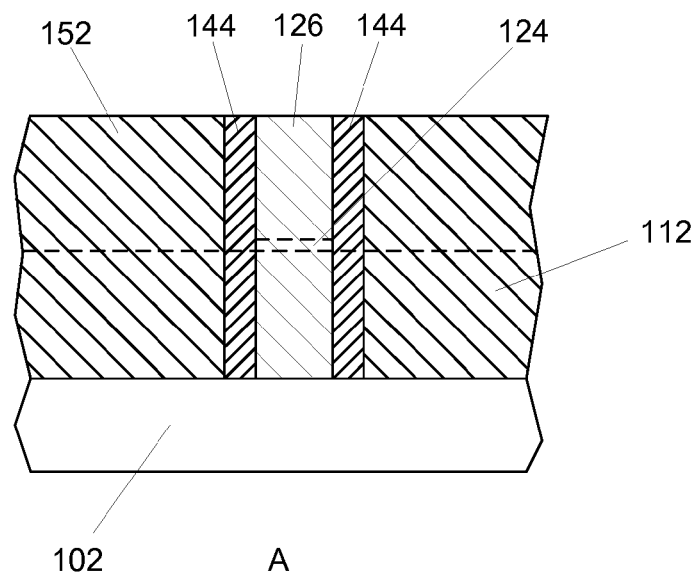
FIG. 15 illustrates a side cross-sectional view of the structure of FIG. 14 after the removal of excess conductive gate material to form a non-planar transistor gate, according to an embodiment of the present description.

As shown in FIG. 14, a conductive gate material 156 may be deposited in the gate trench 154, and excess conductive gate material 156 (e.g. conductive gate material 156 not within the gate trench 154 of FIG. 12) may be removed to from the non-planar transistor gate electrode 126 (see also FIG. 1), as shown in FIG. 15. The materials and methods of forming the gate electrode 126 have been previously discussed. The removal of the excess conductive gate material 156 may be achieved by any technique known in the art, including but not limited to chemical mechanical polishing (CMP), etching, and the like.

Figure 16:
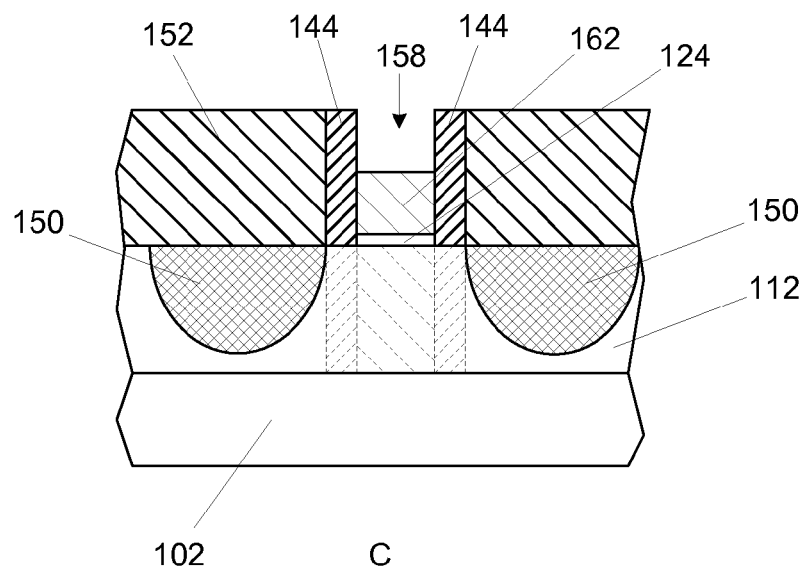
FIG. 16 illustrates a side cross-sectional view of the structure of FIG. 15 after etching away a portion of the non-planar transistor gate to form a recessed non-planar transistor gate, according to an embodiment of the present description.

As shown in FIG. 16, a portion of the non-planar transistor gate electrode 126 may be removed to form a recess 158 and a recessed non-planar transistor gate 162. The removal may be accomplished by any known technique, including but not limited to wet or dry etching.

Figure 17:
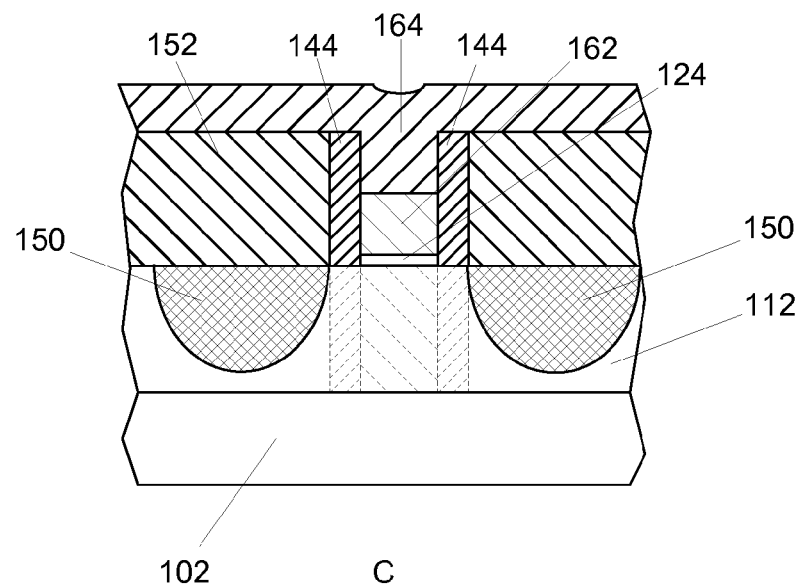
FIG. 17 illustrates a side cross-sectional view of the structure of FIG. 16 after depositing a capping dielectric material into the recess resulting from the formation of the recessed non-planar transistor gate, according to an embodiment of the present description.

As shown in FIG. 17, a capping dielectric material 164 may be deposited to fill the recess 158 of FIG. 16. The capping dielectric material 164 may be any appropriate material, including but not limited to silicon nitride ($Si_xN_y$) and silicon carbide ($Si_xC_y$). However, known processes for depositing dielectrics, such as plasma enhanced chemical vapor deposition, may not be capable of filing recesses 158 that have high aspect ratios (height to width ratio) and may result in voids forming in the capping dielectric material 164. Such voids may result in contact-to-gate short circuits, as will be discussed. To prevent voids from forming, high temperature deposition techniques (e.g. greater than 400° C.) may be employed. However, high temperature deposition may affect the work function of the non-planar transistor gate electrode 126, as will be understood by those skilled in the art. Furthermore, high temperature deposition may result in dopant movement or deactivation in the source/drain regions 150.

Figure 18:
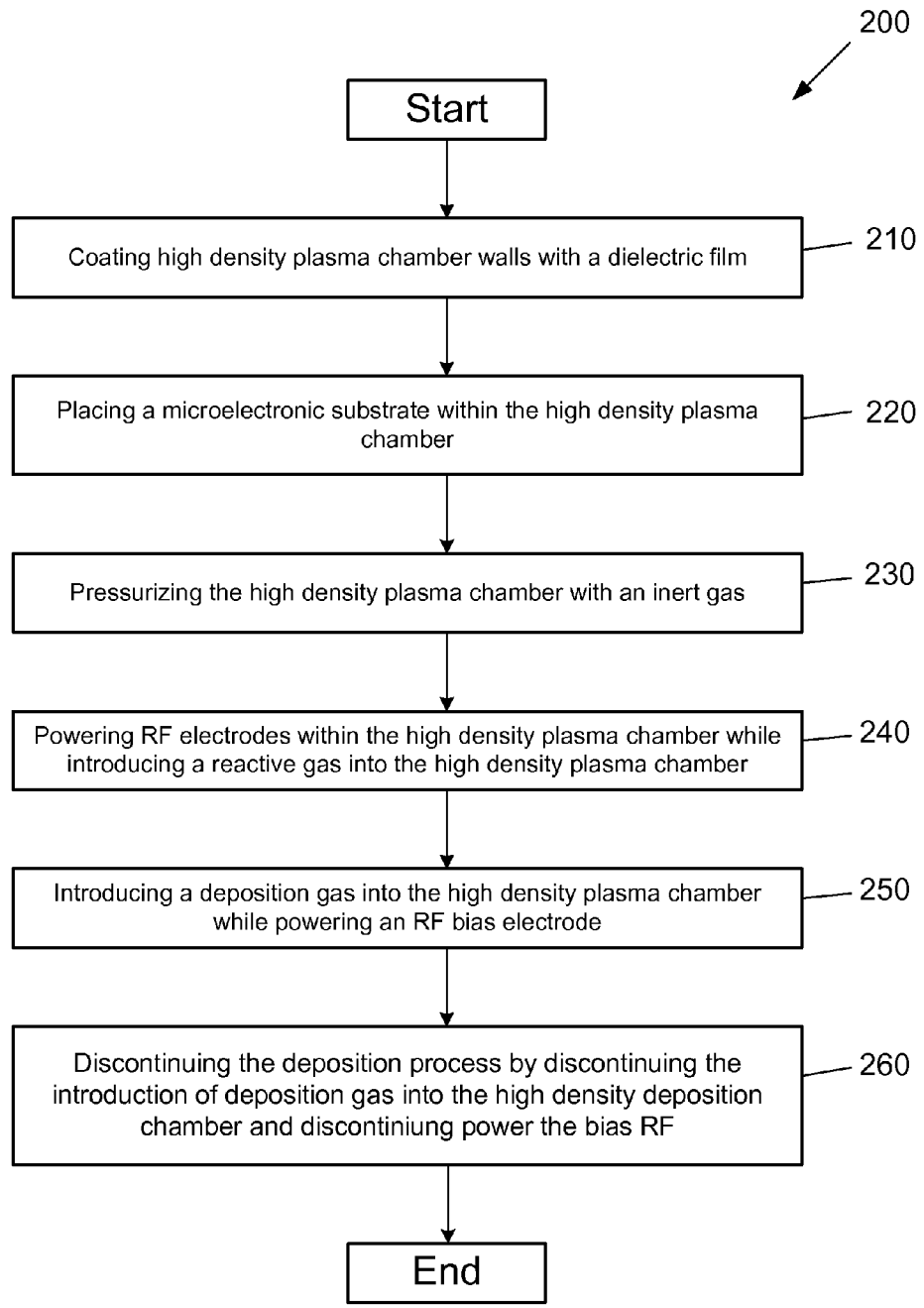
FIG. 18 illustrates a flow diagram of a high density deposition process for the deposition of the capping dielectric material of FIG. 17, according to an embodiment of the present description.

FIG. 18 is a flow diagram of a high density plasma (HDP) dielectric deposition process 200 for forming substantially void free capping dielectric material 164 (see FIG. 17) within a high aspect ratio recesses 158 (see FIG. 17). As defined in block 210, walls of a high density plasma chamber may be coated with a desired dielectric film, i.e. the dielectric to be deposited. As defined in block 220, a microelectronic substrate, such as a silicon wafer, may be placed on a chuck in the high density plasma chamber. In one embodiment, the chuck may be a water-cooled ceramic electrostatic chuck at room temperature, e.g. about 75° C. As defined in block 230, the high density plasma chamber may be pressurized with an inert gas, such as argon. In one embodiment, the high density plasma chamber may be pressure to a pressure greater than about 40 mTorr to strike a sustainable low power radio frequency (RF) plasma. As defined in block 240, RF electrodes within the high density plasma chamber may be powered up while introducing at least one reactive gas into the high density plasma chamber. In one embodiment, each of the RF electrodes, such as top and side electrodes, may be powered up to a range between about 2 kV and 8 kV for a time duration between about 30 and 60 seconds. The reactive gas may include, but is not limited to oxygen, nitrogen, and the like. The microelectronic substrate temperature can be modulated between less than about 300° C. and 600° C. by adjusting the temperature of the chuck. It is understood that the time duration, microelectronic substrate temperature, RF power, and reactive gas mixture may be adjusted for a desired deposition result. As defined in block 250, the deposition gas may be introduced to the high density plasma chamber while powering a bias RF electrode. In one embodiment, a deposition gas comprising silane ($SiH_4$), nitrogen ($N_2$), argon (Ar), and helium (He) may be used to deposit a silicon nitride dielectric. In another embodiment, a deposition gas comprising silane ($SiH_4$), methane ($CH_4$), argon (Ar), and helium (He) may be used to deposit a silicon carbide dielectric. The RF electrode may be power to a range between about 3 kV and 5 kV with a bias RF electrode ranging from about 1 kV and 3 kV. The ratio of the nitrogen gas volume to the silane gas volume for silicon nitride deposition and ratio of the methane gas volume to the silane gas volume may be between about 0.5 and 9, depending on the desired properties of the dielectric layer, while the silane gas flow is kept between about 30 and 70 sccm. Under these conditions, the deposition rate may be in a range between about 7 to 30 Angstroms per second. It is understood that the deposition duration may be calculated based on the desired dielectric layer thickness and deposition rate. As defined in block 260, the deposition process is discontinued by discontinuing the introduction of deposition gas into the high density plasma deposition chamber and discontinuing power to the bias RF. The power to the RF electrodes may be ramped down and electrostatic charges are dissipated off of the microelectronic substrate, so that the microelectronic substrate can be removed from the electrostatic chuck. After removal the high density plasma chamber may be cleaned, such as by a remote plasma unit, and the walls of the high density plasma chamber may be recoated with a desired dielectric film.

The above-described process may result in simultaneous deposition and sputtering of the dielectric layer, wherein an appropriate deposition to sputtering ratio may result in a substantially void-free dielectric layer.

Figure 19:
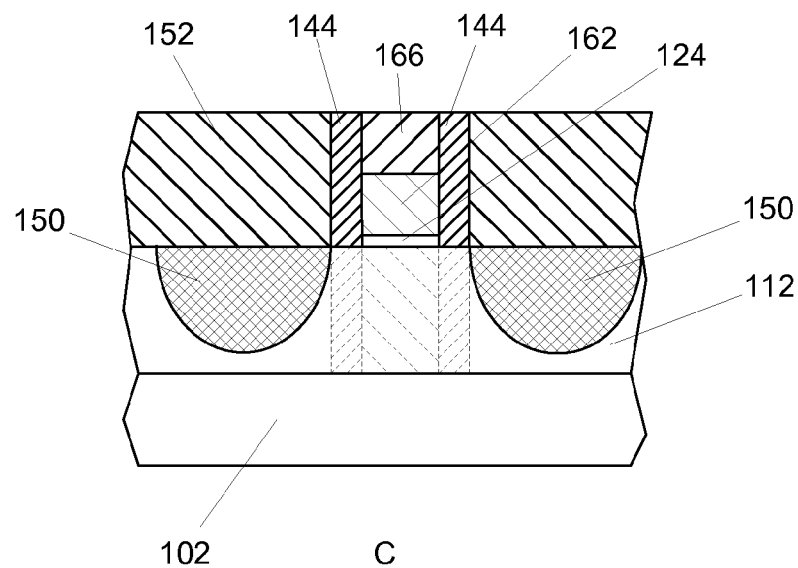
FIG. 19 illustrates a side cross-sectional view of the structure of FIG. 17 after the removal of excess capping dielectric material to form a capping dielectric structure on the non-planar transistor gate, according to an embodiment of the present description.

After deposition, the capping dielectric material 164 may be planarized to remove excess capping dielectric material 164 (e.g. capping dielectric material 164 not within the recess of FIG. 16) to form a capping dielectric structure 166 on the recessed non-planar transistor gate 162 and between a gate spacers 144, as shown in FIG. 19. The removal of the excess capping dielectric material 164 may be achieved by any technique known in the art, including but not limited to chemical mechanical polishing (CMP), etching, and the like.

Figure 20:
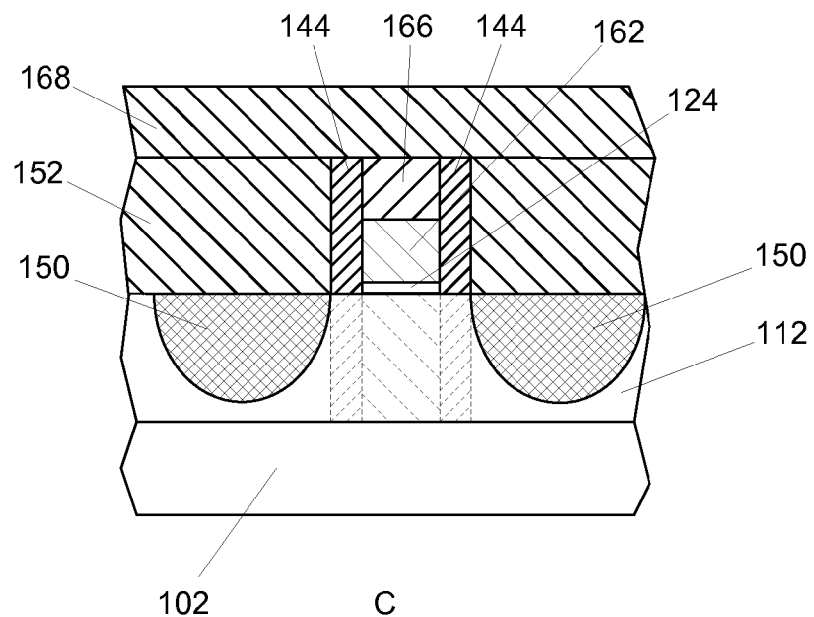
FIG. 20 illustrates a side cross-sectional view of a second dielectric material deposited over the first dielectric material layer, the gate spacers, and the sacrificial gate top surface of FIG. 19, according to an embodiment of the present description.
Figure 21:
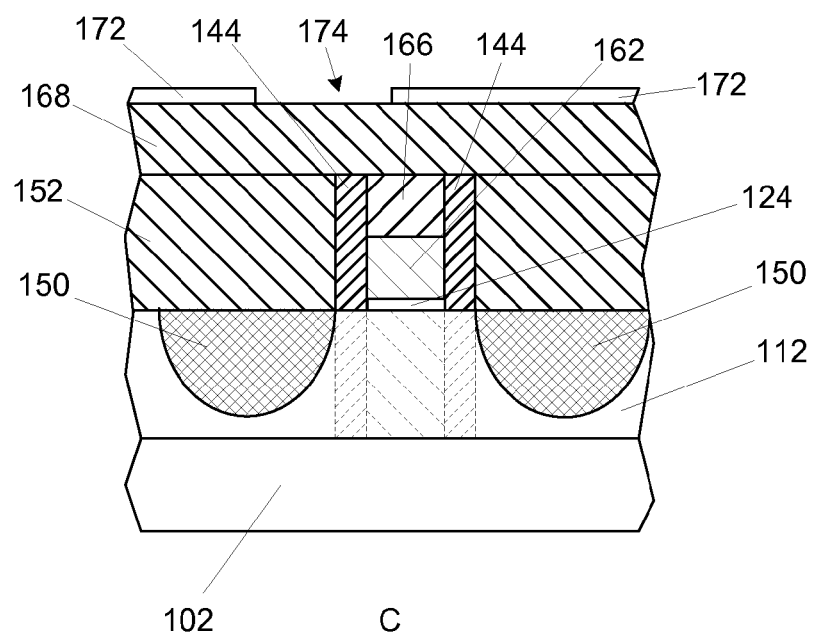
FIG. 21 illustrates a side cross-sectional view of an etch mask patterned on the second dielectric material of FIG. 20, according to an embodiment of the present description.

As shown in FIG. 20, a second dielectric material layer 168 may be deposited over the first dielectric material layer 152, the gate spacers 144, and the capping dielectric structure 166. The second dielectric material layer 168 may be formed from any appropriate dielectric material, including but not limited to silicon dioxide ($SiO_2$), silicon oxynitride ($SiO_xN_y$), and silicon nitride ($Si_3N_4$), by any known deposition technique. As shown in FIG. 21, an etch mask 172 may be patterned with at least one opening 174 on the second dielectric material layer 168, such as by well known lithographic techniques.

Figure 22:
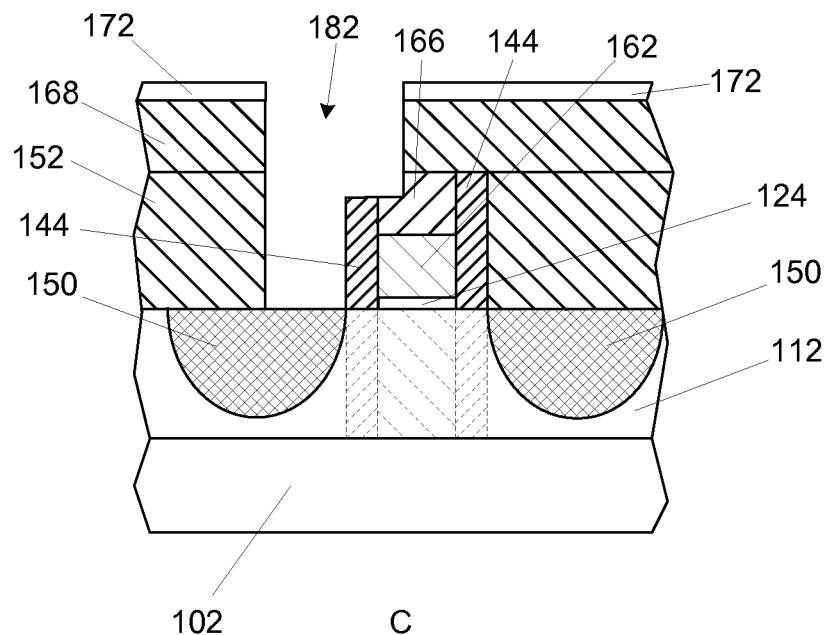
FIG. 22 illustrates a side cross-sectional view of a contact opening formed through the first and second dielectric material layer of FIG. 21, according to an embodiment of the present description.
Figure 23:
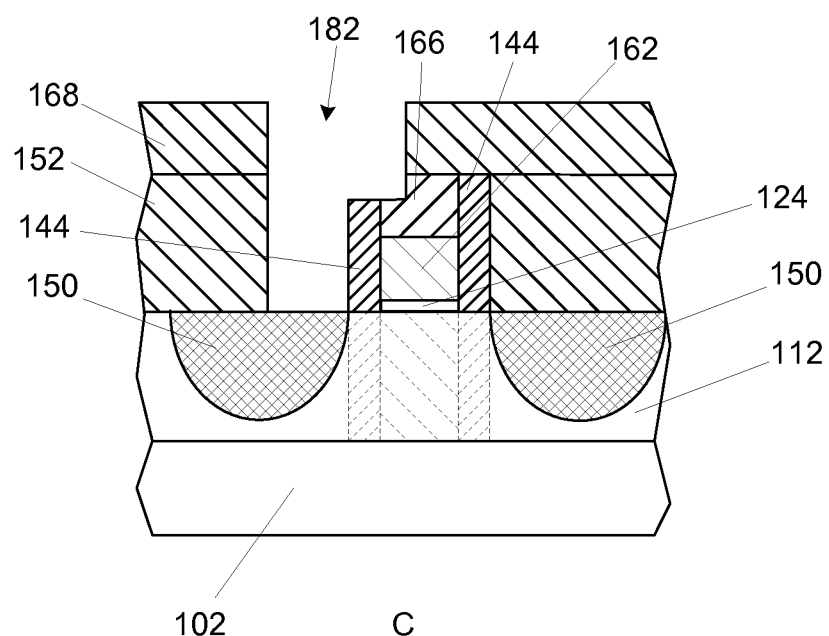
FIG. 23 illustrates a side cross-sectional view of the structure of FIG. 22 after the removal of the etch mask, according to an embodiment of the present description.

As shown in FIG. 22, a contact opening 182 may be formed through the first dielectric material layer 152 and the second dielectric material layer 168 by etching through the etch mask opening 174 of FIG. 21 to expose a portion of the source/drain region 150. The etch mask 172 of FIG. 22 may be removed thereafter, as shown in FIG. 23. In one embodiment, the first dielectric material layer 152 and the dielectric material layer 168 differs from dielectric material of both the gate spacers 144 and the capping dielectric structure 166, such that the etching of the first dielectric material layer 152 and the second dielectric layer 168 may be selective to the gate spacers 144 and the capping dielectric structure 166 (i.e. etches faster). This is known in the art as a self-aligning.

Figure 24:
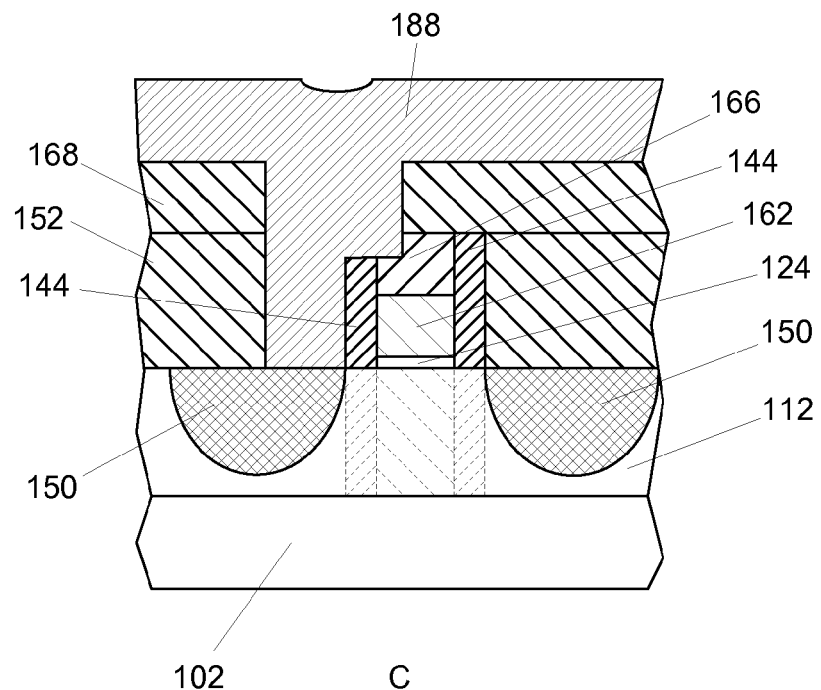
FIG. 24 illustrates a side cross-sectional view of a conductive contact material deposited in the contact opening of FIG. 23, according to an embodiment of the present description.

As shown in FIG. 24, a conductive contact material 188 may be deposited in the contact opening 182 of FIG. 23. The conductive contact material 188 may include, but is not limited to, polysilicon, tungsten, ruthenium, palladium, platinum, cobalt, nickel, hafnium, zirconium, titanium, tantalum, aluminum, titanium carbide, zirconium carbide, tantalum carbide, hafnium carbide, aluminum carbide, other metal carbides, metal nitrides, and metal oxides. It is understood that various adhesion layers, barrier layers, silicide layers, and/or conductive layers may be conformally disposed or formed in the contact opening 182 of FIG. 23 prior to the deposition of the conductive contact material 188.

Figure 25:
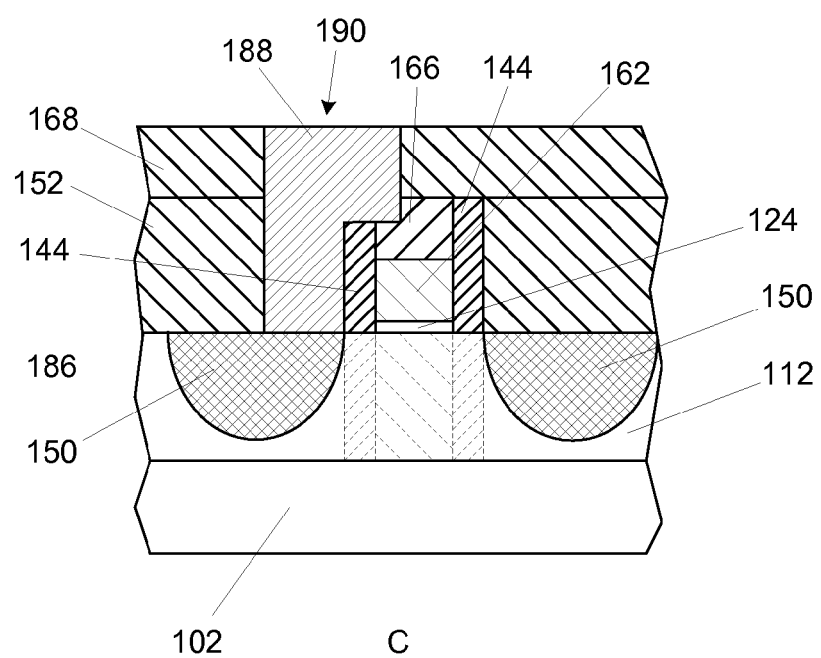
FIG. 25 illustrates a side cross-sectional view of the structure of FIG. 24 after the removal of the excess conductive contact material to form a source/drain contact, according to an embodiment of the present description.

As shown in FIG. 25, excess conductive contact material 188 of FIG. 24 (e.g. conductive contact material 188 not within the contact opening 182 of FIG. 12) may be removed to form a source/drain contact 190. The removal of the excess conductive contact material 188 may be achieved by any technique known in the art, including but not limited to chemical mechanical polishing (CMP), etching, and the like.

As previously discussed, in one embodiment, the first dielectric material layer 152 and the dielectric material layer 168 differs from dielectric material of both the gate spacers 144 and the capping dielectric structure 166, such that the etching of the first dielectric material layer 152 and the second dielectric layer 168 may be selective to the gate spacers 144 and the capping dielectric structure 166 (i.e. etches faster). Thus, the recessed non-planar transistor 162 is protected during the formation of the contact opening 182. This allows for the formation of a relatively large sized source/drain contact 190, which may increase the transistor drive current performance, without the risk of shorting between the source/drain contact 190 and the recessed non-planar transistor gate 162. This is not possible if voids exist in the capping dielectric structure 144, as the voids would increase the likelihood of shorting between the source/drain contact 190 and the recessed non-planar transistor gate 162.

It is understood that the subject matter of the present description is not necessarily limited to specific applications illustrated in FIGS. 1-25. It is understood that although the illustrated embodiments are directed to non-planar applications, the subject matter may be applied to non-planar transistors and to non-replacement gate applications. Furthermore, the subject matter may be applied to other microelectronic device fabrication applications, as will be understood to those skilled in the art.

Having thus described in detail embodiments of the present invention, it is understood that the invention defined by the appended claims is not to be limited by particular details set forth in the above description, as many apparent variations thereof are possible without departing from the spirit or scope thereof.

What is claimed is:

1. A method of fabricating a transistor gate, comprising:
   forming a pair of gate spacers;
   forming a gate electrode disposed between and contacting the pair of gate spacers;
   removing a portion of the gate electrode to form a recess;
   high density plasma depositing a capping dielectric structure within the recess on a top surface of the recessed gate electrode and between the pair of gate spacers;
   forming a source/drain region;
   forming at least one dielectric material over the source/drain region, the non-planar transistor gate spacers, and the capping dielectric structure; and
   forming a contact opening through the at least one dielectric material to expose at least a portion of the source/drain region and which removes a portion of the capping dielectric structure.

2. The method of claim 1, wherein high density plasma depositing the capping dielectric structure comprises high density plasma depositing a silicon nitride capping dielectric structure.

3. The method of claim 1, wherein high density plasma depositing the capping dielectric structure comprises high density plasma depositing a silicon carbide capping dielectric structure.

4. The method of claim 1, wherein high density plasma depositing the capping dielectric structure comprises high density plasma depositing the capping dielectric structure at a temperature between about 300° C. and 600° C.

5. A method comprising:
   forming a non-planar transistor fin;
   forming a pair of non-planar transistor gate spacers adjacent the sacrificial non-planar transistor fin;
   depositing conductive gate material between and contacting the non-planar transistor gate spacers;
   removing a portion of the conductive gate material to form a recess between the non-planar transistor gate spacers;
   forming a capping dielectric structure within the recess by high density plasma depositing a dielectric material;
   forming a source/drain region;
   forming at least one dielectric material over the source/drain region, the non-planar transistor gate spacers, and the capping dielectric structure; and
   forming a contact opening through the at least one dielectric material to expose at least a portion of the source/drain region and which removes a portion of the capping dielectric structure.

6. The method of claim 5, wherein high density plasma depositing the capping dielectric structure comprises high density plasma depositing a silicon nitride capping dielectric structure.

7. The method of claim 5, wherein high density plasma depositing the capping dielectric structure comprises high density plasma depositing a silicon carbide capping dielectric structure.

8. The method of claim 5, wherein high density plasma depositing the capping dielectric structure comprises high density plasma depositing the capping dielectric structure at a temperature between about 300° C. and 600° C.

9. The method of claim 5, further comprising forming a gate dielectric adjacent the non-planar transistor fin.

10. A method comprising:
    forming a sacrificial non-planar transistor gate over a non-planar transistor fin;
    depositing a dielectric material layer over the sacrificial non-planar transistor gate and the non-planar transistor fin;
    forming non-planar transistor gate spacers from a portion of the dielectric material layer adjacent the sacrificial non-planar transistor gate;
    forming a source/drain region;
    removing the sacrificial non-planar transistor gate to form a gate trench between the non-planar transistor gate spacers and expose a portion of the non-planar transistor fin;
    forming a gate dielectric adjacent the non-planar transistor fin within the gate trench;
    depositing conductive gate material within the gate trench;
    removing a portion of the conductive gate material to form a recess between the non-planar transistor gate spacers;
    forming a capping dielectric structure within the recess by high density plasma depositing a dielectric material;
    forming at least one dielectric material over the source/drain region, the non-planar transistor gate spacers, and the capping dielectric structure; and
    forming a contact opening through the at least one dielectric material to expose at least a portion of the source/drain region and which removes a portion of the capping dielectric structure.

11. The method of claim 10, wherein high density plasma depositing the capping dielectric structure comprises high density plasma depositing a silicon nitride capping dielectric structure.

12. The method of claim 10, wherein high density plasma depositing the capping dielectric structure comprises high density plasma depositing a silicon carbide capping dielectric structure.

13. The method of claim 10, wherein high density plasma depositing the capping dielectric structure comprises high density plasma depositing the capping dielectric structure at a temperature between about 300° C. and 600° C.

* * * * *